United States Patent [19]

Kafka et al.

[11] Patent Number: 4,970,037

[45] Date of Patent: Nov. 13, 1990

[54] PROCESS FOR THE MANUFACTURE OF PHOTOSENSITIVE MATERIALS HAVING A LOW HEAT HISTORY

[75] Inventors: Fred Y. Kafka, Louisville, Ky.; Paul T. Shea, Freehold, N.J.

[73] Assignee: E. I. Du Pont de Nemours and Company, Wilmington, Del.

[21] Appl. No.: 429,578

[22] Filed: Oct. 31, 1989

[51] Int. Cl.[5] ...................... B29C 47/06; B29C 47/60; B29C 47/76

[52] U.S. Cl. .................................... 264/101; 264/171; 264/211; 264/211.21; 264/211.23; 528/502

[58] Field of Search ............... 264/101, 102, 171, 211, 264/211.21, 211.23, 349; 528/502

[56] References Cited

U.S. PATENT DOCUMENTS

| | | | |
|---|---|---|---|
| 2,458,068 | 1/1949 | Fuller | 100/104 |
| 2,538,809 | 1/1951 | Tegrotenhuis | 264/142 |
| 3,222,797 | 12/1965 | Zies | 264/102 X |
| 3,225,453 | 12/1965 | Burner | 34/12 |
| 3,683,511 | 8/1972 | Johnson et al. | 34/9 |
| 3,700,622 | 10/1972 | Terenzi | 523/318 |
| 3,742,093 | 6/1973 | Skidmore | 528/502 X |
| 3,993,292 | 11/1976 | Skidmore | 264/349 X |
| 4,103,074 | 6/1978 | Hertel et al. | 528/487 |
| 4,136,251 | 1/1979 | Bice et al. | 528/502 X |
| 4,148,991 | 4/1979 | Skidmore | 528/502 |
| 4,323,636 | 4/1982 | Chen et al. | 430/271 |
| 4,323,637 | 4/1982 | Chen et al. | 430/271 |
| 4,332,760 | 6/1982 | Warfel | 264/211 X |
| 4,588,780 | 5/1986 | Edwards et al. | 525/184 |

FOREIGN PATENT DOCUMENTS

| | | |
|---|---|---|
| 58-183235 | 10/1983 | Japan . |
| 61-53364 | 11/1986 | Japan . |

*Primary Examiner*—Jeffery Thurlow
*Assistant Examiner*—Leo B. Tentoni

[57] ABSTRACT

This invention relates to a process for preparing a photosensitive composition having a low heat history which includes:

(a) forming a substantially homogeneous dispersion by mixing at least one photoinitiator or photoinitiating system, and at least one binder selected from the group consisting of reactive binders and non-reactive binders in the form of a dispersion provided that when said binder is non-reactive then at least one reactive component is added which is capable of reacting with the photoinitiator;

(b) coagulating the dispersion to form a coagulum and a liquid; and (c) substantially removing the liquid to form a photosensitive composition.

31 Claims, 3 Drawing Sheets

1
2
3
4
5
6
7
8
9
10
11
12
13
14
15
16
17

1
2
3
4
5
6
7
8
9
10
11
12
13
14

PROCESS FOR THE MANUFACTURE OF PHOTOSENSITIVE MATERIALS HAVING A LOW HEAT HISTORY

FIELD OF THE INVENTION

This invention relates to a process for the manufacture of photosensitive materials and, in particular, to the manufacture of materials having a low heat history which are useful in preparing flexographic printing plates, photoresists and other relief and nonrelief images.

BACKGROUND OF THE INVENTION

Photosensitive materials which can be used in preparing either non-relief or relief images are well known in the art. These materials generally comprise a polymeric binder which serves to hold the material together and may or may not enter into a photoinitiated chemical reaction, a photoinitiator or photoinitiator system and, as needed, other components which are capable of reacting with the photoinitiator to produce a change in the physical properties of the material. These components are usually layered on a substrate or support before exposing to actinic radiation through an image-bearing transparency to produce either a positive or negative latent image. The differences in the properties of the exposed and unexposed areas of the photosensitive material, e.g., differences in solubility or swellability, differences in the softening point, differences in tackiness, differences in adhesion, differences in permeability for processing solutions, etc., are used as the basis for developing the image. Depending on the intended end use the developed image may be visible due to color differences, relief height differences, or combinations of the two. For some uses it is not necessary that the developed image be visibly discernible.

A photosensitive element can be made by solvent coating or melt extruding and laminating the photosensitive layer onto the support. Solution coating is commonly used to make photoresists, proofing media and lithographic printing plates. Melt extrusion is frequently used to produce flexographic printing plates. Each of these processes suffers from some disadvantages.

One problem with solvent coating is that it is often difficult to find solvents in which all the ingredients in the photosensitive layer have sufficient solubility so that a smooth transparent coating can be formed. This is particularly true for systems which are developable in aqueous solutions. Furthermore, non-aqueous coating solvents can pose safety and environmental hazards.

In melt extrusion, processing of the photosensitive layer at high temperatures diminishes both sensitivity and photospeed. Thus, the temperature must be kept sufficiently low to prevent degradation and thermally initiated reactions from taking place during processing. Polymeric binders which can be used to formulate a photosensitive composition, are limited to those having low melt temperatures and low melt viscosities in order to maintain sufficiently low processing temperatures. Processing latitude can often be gained by incorporating thermal stabilizers, but these stabilizers often decrease the photosensitivity of the resulting elements.

The various components must be well dispersed within the polymeric binder in order to prevent light scatter from non-homogeneities. Light scatter, in turn, can reduce optical resolution of these elements. In the melt extrusion process, it is often difficult to obtain excellent distributive mixing of the various components at low processing temperatures.

SUMMARY OF THE INVENTION

This invention retlates to a process for preparing a photosensitive composition having a low heat history which comprises:

(a) forming a substantially homogeneous dispersion by mixing at least one photoinitiator, and at least one binder selected from the group consisting of reactive binders and non-reactive binders in the form of a dispersion provided that when said binder is nonreactive then at least one reactive component is added which is capable of reacting with the photoinitiator;

(b) coagulating the product of step (a) to form a coagulum and a liquid; and (c) substantially deliquefying the product of step (b).

In another embodiment, the invention is directed to the above process wherein the process takes place in a screw extruder.

The invention is also directed to the preparation of an elastomeric photosensitive element which can be used as a flexographic printing plate precursor comprising the steps given above.

Finally, the invention concerns the preparation of a thermoplastic photosensitive element which can be used as a photoresist, proofing medium or lithographic printing plate precursor comprising the steps given above.

DETAILED DESCRIPTION OF THE INVENTION

Figure 1:
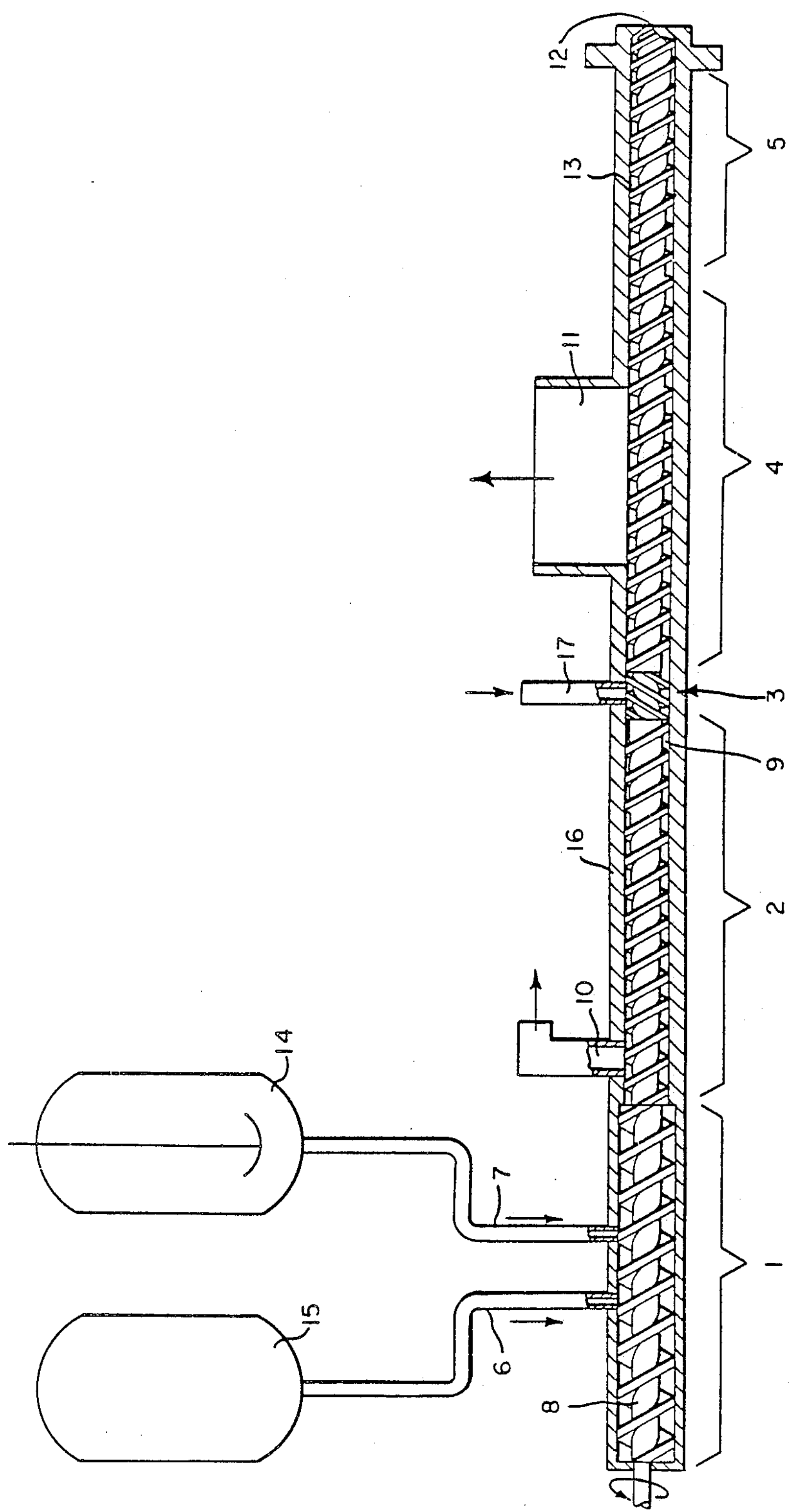
FIG. 1 is a partially diagrammatic, section side view of a dewatering extruder.

The term low heat history is used to indicate that the photosensitive material has not been exposed to high temperatures during processing. It is desirable to avoid high temperatures in order to minimize the occurrence of thermally induced reactions and to reduce the need for thermal stabilizer which can adversely affect sensitivity and photospeed. Thus, it is desirable to keep processing temperatures as low as possible. For example, temperatures below 180° C. are generally acceptable and temperatures below 150° C. are preferred.

The term substantially deliquefying means that less than about 5% liquid remains in the resulting product.

Surprisingly and unexpectedly, it has been found that a photosensitive composition having a low heat history can be made using the process of this invention. Moreover, it is possible to utilize binder polymers such as neoprene which previously could not be melt processed.

A substantially homogeneous dispersion is formed by mixing at least one polymeric binder with at least one photoinitiator wherein the polymeric binder is in the form of a dispersion, i.e., fine particles dispersed in a liquid vehicle. Binders which are suitable in practicing the invention can be reactive or non-reactive. They can be used individually or in combination with one another.

Reactive binders are those which are capable of reacting with the photoinitiator after it has been activated by exposure to actinic radiation. Reactive binders, in general, have reactive linkages or pendant groups such as ethers, acid esters, carbonates, acetals, ketals, and the like. Examples of such binders include those disclosed in U.S. Pat. Nos., 4,247,611, 4,311,247, 3,917,483 and 3,915,704, the disclosures of which are hereby incorporated by reference.

Non-reactive binders are well known in the art and have been mentioned in U.S. Pat. Nos. 3,649,268, 4,323,636, 4,753,865 and 4,726,877, the disclosures of which are hereby incorporated by reference. Furthermore, when the binder is non-reactive at least one reactive component is added to the mixture which is capable of reacting with the photoinitiator after activation by exposure to actinic radiation. Examples of such reactive components include ethylenically unsaturated monomers, materials which react to become more soluble or to generate plasticizers for the binder.

A photoinitiator is a compound or group of compounds activatable by exposure to actinic radiation. Thus, when activated it is capable of reacting with the other reactive components. Photoinitiators are well known in the art. They have been described in U.S. Pat. Nos. 3,649,268, 4,323,636, 4,753,865 and 4,726,877, the disclosure of which is hereby incorporated by reference.

As was mentioned above, the binder is dispersed in a liquid vehicle which can be aqueous or nonaqueous. It is preferred that the liquid vehicle be aqueous in order to avoid all of the disadvantages associated with non-aqueous solvents discussed above. It is important that all the components be dispersible in the liquid vehicle. The non-polymeric components can be dispersed in the same or a similar liquid vehicle used to disperse the polymer prior to adding to the polymeric dispersion. However, the non-polymeric components need not be dispersed prior to adding to the polymeric dispersion.

Mixing can be accomplished by any conventional technique provided that it results in a substantially homogeneous dispersion with all of the components of the photosensitive composition being well dispersed.

The polymeric dispersion and other components can be introduced to the extruder either premixed or added as separate streams and subsequently mixed in the extruder. Although the mixing step can be carried out in a screw extruder, it is preferred that the components be mixed prior to adding to the extruder.

In the coagulating step, the well mixed components are caused to precipitate or settle to form a photosensitive coagulum. This can be accomplished by adding compounds (coagulants) which cause the emulsion to break down and, thus, cause the coagulum to be formed. The choice of coagulant depends to a large extent on the materials used to stabilize the polymeric dispersion. Typically, a surfactant is used. Examples of coagulants which can be used with aqueous vehicles include cationic surfactants, such as polyoxypropylene methyl diethyl ammonium chloride; aqueous solutions of salts such as calcium chloride, aluminum sulfate, sodium chloride, sodium sulfate, sodium acetate and the like; and aqueous solutions of acids such as acetic acid, and aqueous polyamine solutions. These can be used alone or in combination thereof. Alternatively, coagulation can be accomplished by mechanical means, such as the imposition of high shear forces.

The deliquefying step results in the removal of most of the liquid vehicle from the coagulum. This means that at least 95% of the liquid vehicle is removed and, preferably, at least 99% of the liquid vehicle is removed. This can be accomplished in a variety of ways, including pressing or squeezing the coagulum; subjecting the liquid and coagulum to the action of heat, low pressure, or both; or by forcing the coagulum and separated liquid through a region of high pressure as in a screw extruder. In the last case, a low pressure exit is provided upstream of the high pressure and the low viscosity material (liquid) flows countercurrent to the screw. The liquid separation step can be carried out in a single stage or in multiple stages. That is, the bulk of the liquid can be removed in a first stage, e.g.., by the action of a screw extruder, followed by the removal of the residual liquid, e.g., by the application of reduced pressure.

Following deliquefication, the photosensitive composition can be formed into a uniformly thick film or sheet. This is most conveniently done by extruding the material through a die at a temperature sufficient to facilitate extrusion. It is important that the photosensitive material not be heated to a temperature sufficient to cause degradation or thermally induced reactions. Alternatively, the photosensitive material can be in the form of pellets, crumb, ribbon, or blocks which can be further processed by pressing or calendering to produce the desired film or sheet. Another approach entails re-melting the photosensitive material at a low temperature in an extruder such as a single screw extruder and then calendering the extruded product. Processing at the low temperature is possible because the monomer which acts as a plasticizer is dispersed within the polymeric binder.

The photosensitive material can be further processed by affixing the uniform film or sheet to an appropriate support using any conventional technique such as lamination or calendering.

Figure 2:
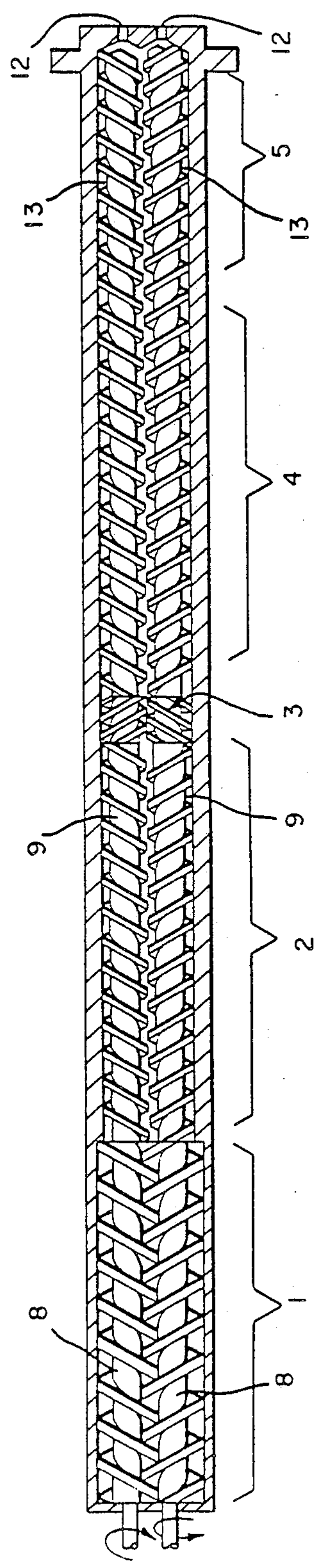
FIG. 2 is a simplified, sectional top view of the dewatering extruder screws, showing the arrangement of their flights.
Figure 3:
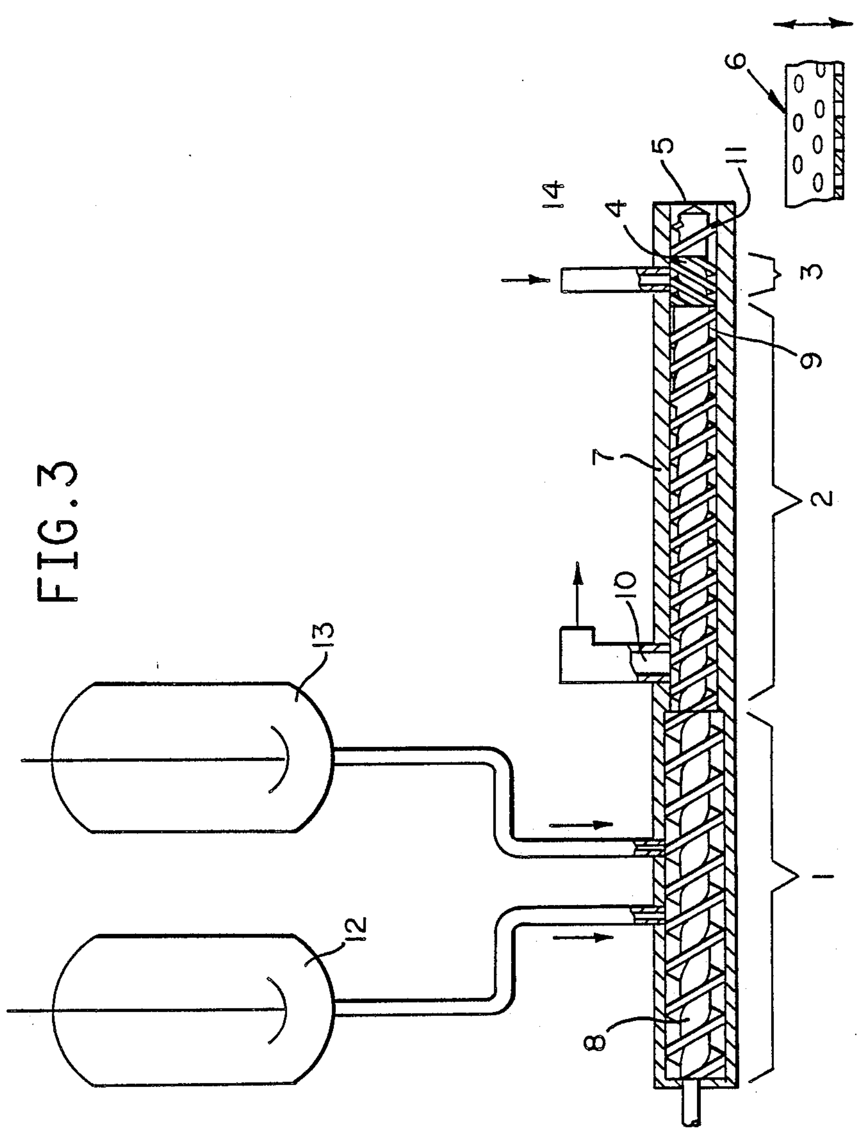
FIG. 3 is a partially diagrammatic, section side view of second type of dewatering extruder.

A preferred process is illustrated by the FIGS. Referring to FIG. 1, 14 is a feed tank containing a mixture of binder polymer dispersion and other additives; 15 is a feed tank containing a coagulating agent such as a surfactant of charge opposite that used in the emulsion polymerization; 16 is a twin-screw extruder housing containing screws 8, as shown in FIG. 2. The extruder is divided into the following five zones; 1, the polymer coagulation zone; 2, the liquid separation zone; 3, the pressure seal; 4, the subatmospheric (reduced) pressure zone; and 5, the polymer removal zone. Optionally, the subatmospheric pressure zone (4) can be omitted as is shown in FIG. 3, but it is preferred that it be present in order to reduce the liquid level of the product. As can be seen in FIG. 1, toward the downstream end of zone 2 the screw channels 9 can be made more shallow to provide a pumping action toward the pressure seal 3. The pressure rises high enough to force the low viscosity fluid to move counter to the screw movement. Waste liquid is removed through port 10. To prevent loss of product with the waste liquid, a mechanical deliquefying device can be installed at that point. This can be, for example, a twin-screw mechanism, which returns product to the extruder. An automatic valve can be provided in the waste liquid exit line to maintain the desired pressure at the upstream end of zone 2. The pressure seal 3 can be one of several devices known to those skilled in extruder technology for providing a high back pressure. Shown in the figures are reverse pitch screw flight sections which are often used for this purpose. Downstream from the pressure seal the extruder is fitted with an additional length of conveying screws for product removal.

Both screws 8 are seen in FIG. 2. It can be seen that in zone 1 the screw flights intermesh, while in zones 2, 4 and 5 they do not intermesh but are tangential.

It is preferred that the extruder be provided with a subatmospheric pressure Zone 4 downstream of the pressure seal for removal of the remaining liquid from the coagulated product mixture by means of a vacuum system communicating with vacuum port 11.

The dried photosensitive product mixture, typically containing less than 5% liquid, after being subjected to low pressure in the extruder, can subsequently be forced through a die and processed further if necessary (e.g. calendered) to put it into final product form for use. Alternatively, the photosensitive product mixture can be directly expelled from the extruder after Zone 3 through an open die and air dried by conventional means. The drawings are simplified in that they do not show various details obvious to those skilled in the art. For example, the housing is shown without any heat transfer means. Obviously, heating or cooling by means of various fluids circulating through a jacket is possible, as well as use of electric heaters or of heating or cooling coils.

In the operation of one embodiment of the process of this invention, binder polymer dispersion and other additives are mixed under low shear conditions in tank 14 and are introduced into the nip between the intermeshing screws by means of a progressive cavity pump or a peristaltic pump. Coagulant from tank 15 can be injected slightly upstream or downstream of the dispersion injection point by means of a positive displacement metering pump. The resulting mixture of coagulum and liquid is conveyed forward toward the pressure seal, which may be, for example, a section of reverse pitch segments of screws as shown, or a section in which clearances between the screws and the housing are reduced to provide a restriction and, therefore, high pressure at the seal. The particular peak pressure depends on the flow rate, restriction design, screw speed and compound viscosity.

Water or other liquid separated from the polymer mixture during the coagulation process cannot pass the pressure seal section and is thus forced back from the pressure seal section and removed through port 10 in zone 2. Coagulum (photopolymer) passing through the pressure seal contains residual liquid. The residual liquid, held by the coagulum which passes through the pressure seal, can be substantially removed in subatmospheric pressure Zone 4. When the liquid vehicle is water, Zone 4 is typically maintained at a pressure of about 200 mm Hg absolute and operated to give a dried product temperature of about 100° C. The dried product is then transported by the action of the extruder screws out of the extruder, optionally, to an attached sheeting die, wherein the dried product is formed into a uniformly thick photosensitive layer. This is then laminated or calendered onto the desired support. Alternatively, coagulum can be expelled from the open bores of the extruder and air dried in conventional equipment such as conveyor driers to obtain a product having less than 5% retained liquid.

Suitable coagulants used in the present process include cationic surfactants (such as polyoxypropylene methyl diethyl ammonium chloride), aqueous solutions of salts (such as calcium chloride, aluminum sulfate, sodium chloride, sodium sulfate, or sodium acetate), and aqueous polyamine solutions. These can also be used, either alone or in conjunction with one another, to neutralize the anionic surfactants commonly used to stabilize the dispersion. The choice of coagulant is dependent on the surfactant used to stabilize the dispersion. Alternatively, mechanical coagulation of the polymer can be conducted by introducing a second high pressure section between the polymer dispersion, monomer and initiator injection point and the waste liquid removal point, the dispersion being coagulated by high shear in this region. Cylindrical barrel-filling screw bushings can be used for this purpose to subject all passing polymer to high sustained shear.

The coagulant can be added upstream or downstream from the point the dispersion is added to the extruder. However, if the dispersion and other components of the mixture are added as separate streams, it is preferred to add the coagulant downstream of the point at which the other components are added to prevent premature coagulation of the polymer prior to introduction of the other components and subsequent loss of those components in the waste liquid. Alternatively, the coagulant can be mixed directly with the other components for separate injection into the extruder either upstream or downstream of the dispersion injection point.

The choice of coagulant and the amount used will depend on the nature of the polymer and the other components as those skilled in the art will appreciate. For most binders used to formulate photosensitive materials, cationic surfactants can be used. The coagulant is usually added as a liquid solution. The particular coagulant concentration in the liquid depends to a large extent on its flow rate.

Water-dispersible thickeners can be used in this process. They can be added separately or with the dispersion, the coagulant, or incorporated into the mixture of other components. The thickener can be used to increase the efficiency of coagulation and can minimize the amount of dispersed polymer in the effluent water. Suitable thickeners are Alcogum 6625 sodium polyacrylate and Alcogum SL-76 acrylic emulsion terpolymer, available from Alco Chemical Company. Other suitable thickeners include, for example, hydroxyethylcellulose, various starches, gums and peptides known to those skilled in the art.

As was mentioned above, the photosensitive composition which can be used in the process of this invention comprises at least one polymeric binder, a photoinitiator and can contain other additives necessary to give the desired physical properties of the material. The choice of binders, initiators and other components to be used in the photosensitive material depends on the type of photosensitive system desired. Examples of different types of photosensitive systems that can be used include those which, after exposure to light, (1) become more or less soluble in developer solvents (photoinsolubilizable or photosolubilizable); (2) become more or less tacky (phototackifiable or photodetackifiable); (3) become more or less adhesive to certain substrates (photoadhesive); (4) become more or less conductive (photoconductive); or (5) alter the refractive index. The choice of the photosensitive system to be used depends largely on the intended end use and other necessary properties.

Illustrative of one type of photosensitive system which can be used in the process of this invention are photoinsolubilizable materials. These materials generally comprise at least one addition polymerizable monomer in addition to the polymeric binder, photoinitiator or photoinitiator system and other optional additives. The binder is generally a thermoplastic and/or elastomeric polymer or mixture of polymers. The binder serves to hold the mixture together as well as to impart the properties that are needed for the intended end use. For example, photosensitive elements that are to be used as flexographic printing plate precursors must use binders that have elastomeric characteristics so that the resulting printing plates have the flexibility and hardness required by that industry.

On the other hand, lithographic printing plate precursors and photoresists generally require hard and tough thermoplastic binders with appropriate oleophilic and chemical resistance properties, respectively.

In addition, the binder must possess the appropriate solubility characteristics in the developer of choice. It must be soluble or dispersible in the developer prior to polymerization of the monomer. After imagewise exposure the combination of the binder and the polymerized monomer must be insoluble in the developer.

Within the above-described limitations for the binder, almost any polymeric binder can be used for photoinsolubilizable systems in the process of the current invention as long as the binder can be obtained in the form of a latex or dispersion. This is particularly advantageous for elastomeric or thermoplastic-elastomer binders, many of which are prepared in the form of a latex and require an extra processing step to put them in a form that is suitable for melt extruding. This is also an advantage for aqueous-developable polymers which are often not easily dissolved in solvents for coating.

Suitable polymeric binders are well known in the art. Examples include: polyacrylate and alphaalkyl polyacrylate esters, e.g., polymethyl methacrylate and polyethyl methacrylate; polyvinyl esters, e.g., polyvinyl acetate, polyvinyl acetate/acrylate, polyvinyl acetate/-methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3-polymers, chlorinated rubber, and styrene/butadiene/styrene, styrene/isoprene/styrene block copolymers; high molecular weight polyethylene oxides of polyglycols having average molecular weights from about 4,000 to 1,000,000, epoxides, e.g., epoxides containing acrylate or methacrylate groups; copolyesters, e.g., those prepared from the reaction product of a polymethylene glycol of the formula $HO(CH_2)_nOH$, where n is a whole number from 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids and (5) mixtures of copolyesters prepared from said glycols and (i) terephthalic, isophthalic and sebacic acids and (ii) terephthalic, isophthalic,sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers,e.g., methyl cellulose, ethyl cellulose and benzyl cellulose; polycarbonates; polyvinyl acetal, e.g., polyvinyl butyral, polyvinyl formal; polyformaldehydes.

In the case where aqueous development of the photosensitive layer is desirable, the binder should contain sufficient acidic or other groups to render the layer processible in aqueous developer. Useful aqueous-processible binders include those disclosed in U.S. Pat. No. 3,458,311 and in U.S. Pat. No. 4,273,857. Useful amphoteric polymers include interpolymers derived from N-alkylacrylamides or methacrylamides, an acidic film-forming monomer and an alkyl or hydroxyalkyl acrylate such as those disclosed in U.S. Pat. No. 4,293,635.

It is also possible that the binder be in the form of a microgel or a blend of a microgel and a preformed macromolecular polymeric compound.

Microgels suitable for practicing the present invention are disclosed in U.S. Pat. No. 4,726,877, the disclosure of which is hereby incorporated by reference. Core-shell microgels such as those described in applicant's assignee's co-pending patent application filed Aug. 30, 1988, S.N. 07/238,104, the disclosure of which is hereby incorporated by reference. The term core-shell microgel means a particle having two domains—a crosslinked core and an aqueous processible non-crosslinked shell. The core should have less than 10% crosslinking and the shell consists of an acid-modified copolymer which is not crosslinked.

Core shell microgels are conventionally prepared by emulsion polymerization. The microgels are generally formed from 90 to 99.5% by weight polymer component and 10 to 0.5% by weight crosslinking agent with these materials compatible in formation of a continuous phase system. The polymer components can be varied during polymerization to produce core and shell microgel so that the core has less than 10% crosslinking and the shell is designed for aqueous processibility in that an acid-modified copolymer is used to make the shell. Typically, the microgels used have elastomeric crosslinked cores and aqueous processible elastomeric non-crosslinked shells or a thermoplastic noncrosslinked shell. Elastomers, by definition, have glass transition temperatures below room temperature and thermoplastic materials, by definition, have glass transition temperatures above room temperature. It is also possible to use a microgel having a thermoplastic crosslinked core and a thermoplastic non-crosslinked shell. The choice will depend upon the use to which the photosensitive composition is to be put. A preferred microgel has an elastomeric crosslinked core and an elastomeric non-crosslinked shell.

Core shell microgels can be made from a wide variety of starting materials. Conventionally, mono- or polyethylenically unsaturated monomers are used in preparing the bulk portion of the microgel, whereas the crosslinking agents contain at least two double bonds.

Suitable monomers are esters of acrylic and methacrylic acid with $C_1$–$C_{18}$ alcohols. There can be mentioned methyl methacrylate, ethyl acrylate, methacrylic acid, butyl methacrylate, ethyl methacrylate, glycidyl methacrylate, styrene and allyl methacrylate, while other useful monomers include acrylonitrile, methacrylonitrile, acrylic acid, butadiene (BD) and 2-ethylhexyl acrylate. The preferred monomer for making the core is 2-ethylhexyl acrylate. The preferred acid-modified copolymer for the shell is a methacrylic acid-modified n-butyl acrylate.

Other suitable monomers include vinyl ethers and vinyl esters, nitriles and amides of acrylic and methacrylic acid.

A preferred crosslinking agent is butanediol diacrylate (BDDA); while others include ethylene glycol dimethacrylate, tetramethylene glycol diacrylate, trimethylol propane triacrylate, tetraethylene glycol dimethacrylate, methylene bisacrylamide, methylene bismethacrylamide, divinyl benzene, vinyl methacrylate, vinyl crotonate, vinyl acrylate, vinyl acetylene, trivinyl benzene, glycerine trimethacrylate, pentaerythritol tetramethacrylate, triallyl cyanurate, divinyl acetylene, divinyl ethane, divinyl sulfide, divinyl sulfone, dienes such as butadiene, hexatriene, triethylene glycol dimethacrylate, diallyl cyanamide, glycol diacrylate, ethylene glycol divinyl ether, diallylphthalate, divinyl dimethyl silane, glycerol trivinyl ether and the like.

As was mentioned previously, crosslinking is controlled during manufacture. Thus, core shell microgels having cores with less than 10% crosslinking is accomplished by using 10% or less of the crosslinking agent to crosslink the core, i.e., no crosslinking agent is used to make the shell.

Conventionally, one or more monomers and crosslinking agents are dispersed in water with suitable emulsifiers and initiators in manufacture of the microgel. Conventional anionic, cationic or nonionic emulsifiers and water soluble initiators can be employed. Examples of emulsifying agents are sodium lauryl sulfate, lauryl pyridine chloride, polyoxyethylene, polyoxypropylene, colloidal silica, anionic organic phosphates, magnesium montmorillonite, the reaction product of 12 to 13 moles of ethylene oxide with 1 mole of octyl phenol, secondary sodium alkyl sulfates and mixtures thereof. Usually from 0.25 to 4% of emulsifier based on the total weight of reactants is used. Examples of initiators are potassium persulfate, sodium persulfate, ammonium persulfate, tertiary butyl hydroperoxide, hydrogen peroxide, azo bis(isobutyronitrile), azo bis(isobutyroimidine hydrochloride), various redox (reduction-oxidation) systems such as hydrogen peroxide and ferrous sulfate and well known persulfate-bisulfate combinations. Usually from 0.05 to 5% by weight of initiator based on the weight of copolymerizable monomers is used.

Microgels can be produced by the technique of emulsion polymerization as described in U.S. Pat. No. 3,895,082. (Also, British Pat. No. 967,051 teaches a suitable method.) This technique can also be modified by beginning the reaction with one set of monomers and by varying the ratios for the final part of the reaction in order to produce spherical microgels in which the inner part of the polymer, i.e., the core is a different monomeric composition than the outer part of the polymer, i.e., shell. It is also desired that the shell be designed for aqueous processibility. This is achieved by constructing the shell so that it has an acid-modified copolymer. The core can be elastomeric while the shell can be either elastomeric or thermoplastic.

The art of emulsion polymerization is well known concerning reaction conditions to produce spherical microgels dispersed in a water phase. Unless the dispersion can be used as made and contain no objectionable impurities or byproducts, it is usually necessary to convert the microgels to a solid prior to their use as a photosensitive composition. Well-known techniques of coagulation, filtration, washing and drying can be employed for this purpose. Freeze drying is a particularly useful method for the present invention. Generally the amount of crosslinking agent in the microgel will be less than 20% by weight of the overall weight of the microgel and generally less than 10% by weight.

The weight ratio of the core to the shell is usually in the range from about 4:1 to about 1:4.

Compositions of some of the microgels produced and tested and found useful are set forth in Table 1. All parts are by weight.

TABLE 1

| | MICROGEL COMPOSITION | | | | | | | | |
|---|---|---|---|---|---|---|---|---|---|
| Core*/Shell Microgel | 2-EHA | BD | BDDA | MMA | nBA | MAA | EA | AA | Core/Shell Weight ratio |
| A Core | 98.5 | — | 0.5 | — | — | — | — | — | A Core/A Shell |
| A Shell[1] | — | — | — | 51 | — | 20 | 29 | — | 2:1 |
| B Core | 98.5 | — | 0.5 | — | — | — | — | — | B Core/B Shell |
| B Shell | — | — | — | — | 80 | 20 | — | — | 2:1 |
| C Core | 98 | — | 1.0 | — | — | — | — | — | C Core/C Shell |
| C Shell | — | — | — | — | 80 | 20 | — | — | 2:1 |
| D Core | — | 100 | — | — | — | — | — | — | D Core/D Shell |
| D Shell | — | — | — | — | 80 | 20 | — | — | 2:1 |
| E Core | — | 100 | — | — | — | — | — | — | E Core/E Shell |
| E Shell | — | — | — | — | 80 | 20 | — | — | 1:1 |
| F Core | 98 | — | 1.0 | — | — | — | — | — | F Core/F Shell |
| F Shell | — | — | — | — | 80 | — | — | 20 | 2:1 |
| G Core | 97 | — | 2.0 | — | — | — | — | — | G Core/G Shell |
| G Shell | — | — | — | — | 80 | 20 | — | — | 2:1 |
| H Core | 98 | — | 1.0 | — | — | — | — | — | H Core/H Shell |
| H Shell | — | — | — | — | 80 | — | — | 20 | 1:1 |
| I Core | 98 | — | 1.0 | — | — | — | — | — | I Core/I Shell |
| I Shell | — | — | — | — | 80 | 20 | — | — | 1:1 |
| J Core | 98 | — | 1.0 | — | — | — | — | — | J Core/J Shell |
| J Shell | — | — | — | — | 70 | 30 | — | — | 2:1 |
| K Core | 98 | — | 1.0 | — | — | — | — | — | K Core/K Shell |
| K Shell | 80 | — | — | — | — | 20 | — | — | 2:1 |
| L Core | — | — | 1.0 | — | 98 | — | — | — | L Core/L Shell |
| L Shell | — | — | — | — | 80 | 20 | — | — | 2:1 |
| M Core | 98 | — | 1.0 | — | — | — | — | — | M Core/M Shell |
| M Shell | — | — | — | — | 80 | 20 | — | — | 1:2 |
| N Core | 98 | — | 1.0 | — | — | — | — | — | N Core/N Shell |
| N Shell | — | — | — | — | 80 | 20 | — | — | 1:4 |
| O Core | 98 | — | 1.0 | — | — | — | — | — | O Core/O Shell |

TABLE 1-continued

| | MICROGEL COMPOSITION | | | | | | | | |
|---|---|---|---|---|---|---|---|---|---|
| Core*/Shell Microgel | 2-EHA | BD | BDDA | MMA | nBA | MAA | EA | AA | Core/Shell Weight ratio |
| O Shell | — | — | — | — | 87 | 13 | — | — | 1:1 |

BD = butadiene
BDDA = butanediol diacrylate
2-EHA = 2-ethylhexyl acrylate
MMA = methyl methacrylate
EA = ethyl acrylate
nBA = n-butyl acrylate
AA = acrylic acid
MAA = methacrylic acid
*All cores also contained 1% allyl methacrylate (AMA), except D and E.
[1]This is a thermoplastic shell. Shells B-O are elastomeric.

Preformed macromolecular polymers which can be used in a blend with a microgel contain sufficient acidic or other groups so that the binder is also processible in a semi-aqueous or aqueous developer. Useful aqueous-processible binders include those disclosed in U.S. Pat. No. 3,458,311 and in U.S. Pat. No. 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. For aqueous development, those portions of the photosensitive layer which have not been exposed to radiation will be removed during development by a liquid such as wholly aqueous solutions containing 2% sodium carbonate by weight. The exposed portions will not be affected by development.

Generally, the binder will be present in an amount from 1 to 90% by weight of the components: monomer, initiating system, and binder.

An example of suitable concentrations by weight in a photosensitive composition based on these constituents is:

(a) from 5% to 50% of an addition polymerizable ethylenically unsaturated monomer;

(b) from 0.01% to 15% of an initiating system activated by actinic radiation;

(c) from 1% to 90% by weight of a binder.

It is preferred that the binder in photoinsolubilizable systems be present in at least 35% by weight of the photosensitive layer.

The monomer in photoinsolubilizable systems is an addition-polymerizable ethylenically unsaturated compound. The photosensitive layer can contain a single monomer or a mixture of monomers which must be compatible with the binder to the extent that a clear, non-cloudy photosensitive layer is produced. Monomers that can be used in photoinsolubilizable systems are well known in the art. Examples of such monomers can be found in U.S. Pat. Nos. 4,323,636, 4,753,865 and 4,726,877 and applicant's assignee's co-pending application U.S. application Ser. No. 238,105 filed on Aug. 30, 1988, now U.S. Pat. No. 4,894,315. It is preferred that the monomer be present in at least 5% by weight of the photosensitive layer.

The photoinitiator in photoinsolubilizable systems is one which is activated by actinic radiation to generate free radicals which catalyze the polymerization of the monomer(s). Photoinitiators which can be used in photosensitive systems are well known in the art.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10anthraquinone, 1-chloroanthraquinone, 2chloroanthraquinone, 2-methylanthraquinone, 2ethylanthraquinone, 2-tert-butylanthraquinone, octamethylanthraquinone, 1,4-naphthoquinone, 9,10phenanthrenequinone, 1,2-benzanthraquinone, 2,3benzanthraquinone, 2-methyl-1,4-naphthoquinone, 2,3dichloronaphthoquinone, 1,4-dimethylanthraquinone, 2,3dimethylanthraquinone, 2-phenylanthraquinone, 2,3diphenylanthraquinone, sodium salt of anthraquinone alpha-sulfonic acid, 3-chloro-2-methylanthraquinone, retenequinone, 7,8,9,10-tetrahydro-naphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-benzoin and alpha-phenylbenzoin. Photoreducible dyes and reducing agents disclosed in U.S. Pat. Nos. 2,850,445; 2,875,047; 3,097,096;3,074,974; 3,097,097; and 3,145,104, as well as dyes of the phenazine, oxazine, and quinone classes; Michler's ketone, benzophenone, 2,4,5-triphenylimidazolyl dimers with hydrogen donors, and mixtures thereof as described in U.S. Pat. Nos. 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162. Initiators are present in amounts from 0.001% to 10.0% or more based on the weight of the photosensitive composition.

The photoinsolubilizable material can also contain other additives as long as these do not interfere with the photosensitivity and other necessary properties of the layer. Examples of additives include plasticizers, thermal inhibitors, antioxidants, dyes, antihalation dyes, fillers, reinforcing agents and the like.

Photosensitive elements using photosensitive materials of any type may be prepared by applying the photosensitive material to a substrate or support. This can be accomplished by lamination or calendering techniques. The photosensitive material can be extruded directly onto the support and calendered. Alternatively, the photosensitive material can be extruded or pressed onto a temporary support, with or without a release layer, and later laminated onto the support of choice.

Suitable support materials include metals, e.g., steel and aluminum plates, sheets and foils; and films or plates composed of various film-forming synthetic resins or high polymers, such as polyamides, polyimides, polyolefins, polyesters, vinyl polymers, and cellulose esters.

It will be recognized by those skilled in the art that the support can be altered so as to impart additional properties to the photosensitive element as desired for the end use.

The photosensitive element can also include a cover layer and a release layer. The cover layer can be a single layer or a multi-layer element and is used to prevent contamination of or damage to the photosensitive layer during storage or manipulation. The release layer is used to facilitate removal of an image-bearing film from the photosensitive element after the element has been imagewise exposed through the film.

In general, the process of preparing a relief or non-relief image from the photosensitive element includes the steps of imagewise exposure and development. Imagewise exposure is generally accomplished by exposure through an image-bearing transparency. The selection of radiation source and exposure time will depend on the particular photosensitive element used. Methods for the determination of such parameters are well known by those skilled in the art. Development can be accomplished by a variety of techniques depending on the type of photosensitive system used. Examples of development techniques include washout of exposed or unexposed areas; application of particulate or liquid toner materials which adhere selectively to either exposed or unexposed areas; and transfer of either exposed or unexposed areas to a support. Other post-development treatments can be used as necessary.

EXAMPLES

The present invention is illustrated below by the following preferred embodiments wherein all parts, proportions, and percentages are by weight unless otherwise indicated.

EXAMPLE 1

This example illustrates the process of the invention using photosensitive material which is photoinsolubilizable and useful in the production of flexographic printing plate precursors.

A monomer/initiator mixture was prepared with the following ingredients:

| Ingredient | Parts by Weight |
|---|---|
| Hexamethylene glycol diacrylate | 31.8 |
| Polyoxyethylated trimethylol propane triacrylate | 47.7 |
| Dimethoxy phenylacetophenone | 16.3 |
| 2,6-Di-t-butyl-4-methylphenol | 3.6 |
| TAOBN (a) | 0.2 |
| Hydroxyethyl methacrylate | 0.4 |
| Neozapon ® Red (b) | 0.04 |

(a) 1,4,4-trimethyl-2,3-dizaobicyclo-(3.2.2)-non-2-ene-2,3-dioxide
(b) C.I. Solvent Red 109 and Basic Violet 10; CAS No. 53802-03-2; BASF Wyandott, Holland, MI One part (16.8 kg) of the above mixture was mixed for three minutes with two parts demineralized water in multiple batches using a Ross, one HP, high shear mixer. The resulting dispersion, 111 pounds (50.4 kg) was added to 427 pounds (194 kg) of polymer latex. The polymer was n-butyl acrylate/methacrylic acid (85/15) with 0.75% ally lmethacrylate added. The final latex was 28% solids.

The resulting dispersion was agitated with a low shear mixer in a make-up tank and fed through a 2L3 Moyno pump to the first zone of a nominal 2 inchdiameter counter-rotating dewatering extruder. The extruder has been described in U.S. Pat. No. 4,136,251. A separate coagulant feed of polyoxypropylene methyl diethyl ammonium chloride as a 12% aqueous solution was also fed at a rate of 5% (based on the latex dry weight) into the first zone of the extruder. The polymer coagulation Zone 1 was heated at a temperature of 78° C. in the first half of that zone, and 93° C. in the remainder. The liquid separation zone, Zone 2, and pressure seal, Zone 3, were heated at a temperature of about 92° C. The reduced pressure zone, Zone 4, was heated at 122° C., and the polymer removal zone, Zone 5, was heated to 114° C. The majority of the water was removed in Zone 2 with the remainder removed in the vent section, Zone 4. The dry photosensitive material was extruded at a rate of 43 pounds per hour (20 kg per hour) through a ribbon die at a temperature of 107° C.

Seventy grams of the resulting photosensitive material was pressed in a 35 mil mold at 138° C. The polymer was sandwiched between a support of 5 mil flame treated polyester film and a cover sheet of 5 mil polyester coated with 40 mg/dm$^2$ hydroxypropyl cellulose release layer. The mold was held in a K+M hydraulic press consecutively at contact for four minutes, under slight pressure (less than 100 psi) for three minutes, at 5000 psi for 2 minutes, and at 10,000 psi for 1 minute. After aging overnight, the plate was covered with a polyvinyl fluoride filter and exposed through the support side for 15 seconds on a CYREL ® 30×40 exposure unit with Du Pont (E. I. du Pont de Nemours and Company, Wilmington, DE) exposure lamps P/N 276208-001. The polyester cover sheet was removed and an image bearing negative was placed on the protective release layer. The plate was placed in a vacuum frame and again exposed through the negative consecutively for 0.25, 0.5, 0.75, 1, 1.5, 2, 2.5, 3, and 3.5 minutes on different areas of the plate. The plate was then developed by washing out in 0.5% by weight NaOH in demineralized water for 6 minutes. The developed plate was evaluated by determining the finest dots that were held (not dropped out) for each exposure time. The results are listed below:

| Time (minutes) | % Dot Held (a) |
|---|---|
| 0.25 | — |
| 0.50 | — |
| 0.75 | Most 5 |
| 1.0 | All 5 |
| 1.5 | Most 3 |
| 2.0 | All 3 |
| 2.5 | Some 2 |
| 3.0 | Most 2 |
| 3.5 | All 2 |

(a) Some = <50%
Most = >50%, <90%
All = >90%

A 250 mil sample plate was made as described above. The plate was backexposed as above through the support and a polyvinyl fluoride filter for 1.5 minutes. This was followed by a main exposure, through the top release layer of hydroxypropyl cellulose without a negative or cover sheet for 5 minutes. The durometer hardness and resilience were measured before and after exposure. The durometer was measured using a SHORE ® Durometer Hardness Type A2 instrument (The Shore Instrument and Mfg. Co., Jamaica, NY). The resilience was measured according to ASTM D-2632 using a Model SR-1 SHORE ® resiliometer (The Shore Instrument and Mfg. Co., Jamaica, NY).

| | Shore A | Resilience |
|---|---|---|
| Before Exposure | 21 | 21 |
| After Exposure | 58 | 12 |

EXAMPLE 2

This example illustrates the preparation of photosensitive material similar to Example 1 but using a melt extrusion process.

A monomer/initiator mixture was prepared with the following ingredients:

| Ingredient | Parts by Weight |
|---|---|
| Hexamethylene glycol diacrylate | 31.8 |
| Polyoxyethylated trimethylol propane triacrylate | 47.7 |
| Dimethoxy phenylacetophenone | 16.3 |
| 2,6-Di-t-butyl-4-methylphenol | 3.6 |
| TAOBN (a) | 0.2 |
| Hydroxyethyl methacrylate | 0.4 |
| Neozapon ® Red (b) | 0.04 |

(a) 1,4,4-trimethyl-2,3-dizaobicyclo-(3.2.2)-non-2-ene-2,3-dioxide
(b) C.I. Solvent Red 109 and Basic Violet 10; CAS No. 53802-03-2; BASF Wyandott, Holland, MI The polymer used in Example 1, n-butyl acrylate/methacrylic acid (85/15) with 0.75% allyl methacrylate, was isolated from the latex by freeze drying and then was granulated to facilitate feeding. To the first barrel of a WP 28 mm co-rotating twin screw extruder was fed 57.8 grams per minute of dried polymer followed by 18.0 grams per minute of the above monomer/initiator system into the third barrel. The extruder had a total of 8 barrels which were heated to the following temperatures in °C.:

| Barrel | Temperature (°C.) |
|---|---|
| 1 | 13 |
| 2 | 87 |
| 3 | 119 |
| 4 | 133 |
| 5 | 131 |
| 6 | 87 |
| 7 | 76 |
| 8 | 66 |

The photosensitive polymer was extruder at the screw tips. No extrusion die was used.

A plate was molded in a 35 mil mold, exposed and developed as described in Example 1. The results are given below.

| Time (minutes) | % Dot Held (a) |
|---|---|
| 0.25 | — |
| 0.50 | — |
| 0.75 | — |
| 1.0 | — |
| 1.5 | Most 5 |
| 2.0 | All 5 |
| 2.5 | Some 3 |
| 3.0 | Most 3 |
| 3.5 | All 3 |

(a) Some = <50%
Most = >50%, <90%
All = >90%

A 250 mil sample plate was made as described above. The plate was backexposed as above through the support and a polyvinyl fluoride filter for 1.5 minutes. This was followed by a main exposure, through the top release layer of hydroxypropyl cellulose without a negative or cover sheet for 5 minutes. The Shore A hardness and resilience were measured before and after exposure.

| | Shore A | Resilience |
|---|---|---|
| Before Exposure | 25 | 13 |
| After Exposure | 60 | 12 |

EXAMPLE 3

This example illustrates the process of the invention using neoprene as the polymeric binder. Photosensitive neoprene compositions cannot readily be made using conventional melt extrusion or solvent coating processes.

A monomer/initiator mixture was prepared with the following ingredients:

| Ingredient | Parts by Weight |
|---|---|
| Hexamethylene glycol diacrylate | 31.8 |
| Polyoxyethylated trimethylol propane triacrylate | 47.7 |
| Dimethoxy phenylacetophenone | 16.3 |
| 2,6-Di-t-butyl-4-methylphenol | 3.6 |
| TAOBN (a) | 0.2 |
| Hydroxyethyl methacrylate | 0.4 |
| Neozapon ® Red (b) | 0.04 |

(a) 1,4,4-trimethyl-2,3-dizaobicyclo-(3.2.2)-non-2-ene-2,3-dioxide
(b) C.I. Solvent Red 109 and Basic Violet 10; CAS No. 53802-03-2; BASF Wyandott, Holland, MI One part (43.9 grams) of the above mixture was mixed for three minutes with two parts demineralized water (85.1 grams) in a Scovill Cooking blender at high speed. The resulting dispersion was added to 340 grams of aqueous neoprene latex 735-A (E. I. du Pont de Nemours and Company, Wilmington, DE) containing 45% solids.

The resulting dispersion was agitated by hand mixing. Six grams of coagulant, polyoxypropylene methyl diethyl ammonium chloride, was added to the latex and monomer solution mix (3.9% coagulant based on the dried latex by weight). Acetic acid was then added to lower the pH. The system coagulated at a pH of approximately 5, after the addition of 460 grams of a 10% by weight acetic acid solution in demineralized water. All work was done at room temperature.

The resulting neoprene photopolymer system was dried at 50° C. under slight vacuum for approximately one week. The polymer was then cut into approximate 1 gram pieces and dried overnight at 50° C.

Seventy grams of the resulting photosensitive material was pressed in a 35 mil mold at 120° C. The polymer was sandwiched between a support of 5 mil flame treated polyester film and a cover sheet of 5 mil polyester coated with 40 mg/dm$^2$ MACROMELT® polyamide (Henkel Corp., Minneapolis, MN). The mold was held in a K+M hydraulic press consecutively at contact for 6 minutes, at 5000 psi for 3 minutes, and at 10,000 psi for 2 minutes. The resulting 6×9 inch plate was approximately 48 mils in thickness. The plate was covered with a polyvinyl fluoride filter and exposed through the support side for 15 seconds using the exposure unit described above. The polyester cover sheet was removed and an image bearing negative was placed on the protective release layer. The plate was placed in a vacuum frame and again exposed through the negative for 3 minutes. The plate was then washed-out in a perclene/butanol (75/25 v/v) solution for 6 minutes.

The 2% highlight dot was held on the 110 lines per inch screen. The relief height was 16 mils.

What is claimed is:

1. A process for preparing a photosensitive composition having a low heat history which comprises:

(a) forming a substantially homogeneous dispersion by mixing at least one photoinitiator and at least one binder selected from the group consisting of reactive binders and non-reactive binders in the form of a dispersion provided that when said binder is nonreactive then at least one reactive component is added which is capable of reacting with the photoinitiator;

(b) coagulating the dispersion to form a coagulum and a liquid; and (c) substantially removing the liquid to form a photosensitive composition.

2. A process according to claim 1 wherein step (c) utilizes a subatmospheric pressure zone.

3. A process according to claim 1 or 2 wherein the photosensitive composition is extruded onto a support.

4. A process according to claim 1 wherein steps (a) to (c) are carried out by means of a screw extruder.

5. A process according to claim 1 wherein steps (b) and (c) are carried out by means of a screw extruder.

6. A process according to claim 4 or 5 wherein the extruder is a twin screw extruder having a bore, counter rotating screws and comprising five zones, screw flights in the first zone intermeshing and fully wiping each other as well as the extruder bore, screw flights in zones 2, 4, and 5 being disposed tangentially to each other, a pressure seal between the second zone and the fourth zone constituting the third zone and a liquid evacuation port provided in the second zone.

7. A process according to claim 1 wherein a coagulant is used in step (b).

8. A process according to claim 7 wherein the coagulant is polyoxypropylene methyl diethyl ammonium chloride.

9. A process for preparing a photosensitive composition having a low heat history which comprises:

(a) forming a coagulum and a liquid by mixing a coagulant with at least one photoinitiator and at least one binder selected from the group consisting of reactive binders and non-reactive binders in the form of a dispersion provided that when said binder is nonreactive then at least one reactive component is added which is capable of reacting with the photoinitiator; and (b) substantially removing the liquid to form a photosensitive composition.

10. A process according to claim 9 wherein the photoinitiator is an integral part of the binder.

11. A process according to claim 9 wherein step (b) utilizes a subatmospheric pressure zone.

12. A process according to claim 9 or 11 wherein the photosensitive composition is extruded onto a support.

13. A process according to claim 9 wherein steps (a) and (b) are carried out by means of a screw extruder.

14. A process according to claim 13 wherein the extruder is a twin screw extruder having a bore, counter rotating screws and comprising five zones, screw flights in the first zone intermeshing and fully wiping each other as well as the extruder bore, screw flights in zones 2, 4, and 5 being disposed tangentially to each other, a pressure seal between the second zone and the fourth zone constituting the third zone and a liquid evacuation port provided in the second zone.

15. A process according to claim 9 wherein the coagulant is polyoxypropylene methyl diethyl ammonium chloride.

16. A process for preparing a photosensitive elastomeric element having a low heat history which comprises:

(a) forming a substantially homogeneous dispersion by mixing at least one photoinitiator, at least one ethylenically unsaturated monomer, and at least one elastomeric binder in the form of a dispersion;

(b) coagulating the dispersion to form a coagulum and a liquid;

(c) substantially removing the liquid to form a photosensitive composition; and (d) extruding the photosensitive composition onto a support to form the element.

17. A process according to claim 16 wherein the liquid is water.

18. A process according to claim 16 wherein step (c) utilizes a subatmospheric pressure zone.

19. A process according to claim 16 wherein steps (a) to (d) are carried out by means of a screw extruder.

20. A process according to claim 16 wherein steps (b) to (d) are carried out by means of a screw extruder.

21. A process according to claim 19 or 20 wherein the extruder is a twin screw extruder having a bore, counter rotating screws and comprising five zones, screw flights in the first zone intermeshing and fully wiping each other as well as the extruder bore, screw flights in zones 2, 4, and 5 being disposed tangentially to each other, a pressure seal between the second zone and the fourth zone constituting the third zone and a liquid evacuation port provided in the second zone.

22. A process according to claim 16 wherein a coagulant is used in step (b).

23. A process according to claim 22 wherein the coagulant is polyoxypropylene methyl diethyl ammonium chloride.

24. A process for preparing a photosensitive thermoplastic element having a low heat history which comprises:

(a) forming a substantially homogeneous dispersion by mixing at least one photoinitiator, at least one ethylenically unsaturated monomer, and at least one thermoplastic binder in the form of a dispersion;

(b) coagulating the dispersion to form a coagulum and a liquid;

(c) substantially removing the liquid to form a photosensitive composition; and (d) extruding the photosensitive composition onto a support to form the element.

25. A process according to claim 24 wherein the liquid is water.

26. A process according to claim 24 wherein step (c) utilizes a subatmospheric pressure zone.

27. A process according to claim 24 wherein steps (a) to (d) are carried out by means of a screw extruder.

28. A process according to claim 24 wherein steps (b) to (d) are carried out by means of a screw extruder.

29. A process according to claim 27 or 28 wherein the extruder is a twin screw extruder having a bore counter rotating screws and comprising five zones, screw flights in the first zone intermeshing and fully wiping each other as well as the extruder bore, screw flights in zones 2, 4, and 5 being disposed tangentially to each other, a pressure seal between the second zone and the fourth zone constituting the third zone and a liquid evacuation port provided in the second zone.

30. A process according to claim 24 wherein a coagulant is used in step (b).

31. A process according to claim 30 wherein the coagulant is polyoxypropylene methyl diethyl ammonium chloride.

* * * * *